(12) United States Patent  
Nakata

(10) Patent No.: US 8,797,832 B2  
(45) Date of Patent: Aug. 5, 2014

(54) DECODING METHOD AND DECODING DEVICE

(71) Applicant: Panasonic Corporation, Osaka (JP)

(72) Inventor: Kohei Nakata, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/879,694

(22) PCT Filed: Sep. 24, 2012

(86) PCT No.: PCT/JP2012/006047

§ 371 (c)(1),
(2), (4) Date: Apr. 16, 2013

(87) PCT Pub. No.: WO2013/051211

PCT Pub. Date: Apr. 11, 2013

(65) Prior Publication Data

US 2014/0056116 A1 Feb. 27, 2014

(30) Foreign Application Priority Data

Oct. 4, 2011 (JP) ................................. 2011-220158

(51) Int. Cl.
*G11B 20/10* (2006.01)

(52) U.S. Cl.
USPC ..................................................... 369/47.14

(58) Field of Classification Search
None
See application file for complete search history.

(56) References Cited

U.S. PATENT DOCUMENTS 4,516,163 A * 5/1985 Masuda et al. .................. 360/32
4,815,068 A * 3/1989 Dolby et al. ..................... 369/88
6,654,189 B1 * 11/2003 Sasaki ............................. 360/8
2011/0170576 A1 7/2011 Nagano et al.

FOREIGN PATENT DOCUMENTS

| JP | 2000-286764 | 10/2000 |
| JP | 2002-344414 | 11/2002 |
| JP | 2003-141823 | 5/2003 |
| JP | 2008-216111 | 9/2008 |

OTHER PUBLICATIONS

Machine Translation of Akaike, JP 2000-286764, published Oct. 13, 2000.*
International Search Report issued Nov. 27, 2012 in International (PCT) Application No. PCT/JP2012/006047.
Blu-ray Disc Association, "White Paper Blu-ray Disc Format: 1. A Physical Format Specifications for BD-RE", Oct. 2010.

* cited by examiner

*Primary Examiner* — Peter Vincent Agustin
(74) *Attorney, Agent, or Firm* — Wenderoth, Lind & Ponack, L.L.P.

(57) ABSTRACT

A discrete Fourier transform circuit (201) calculates a first frequency spectrum in a predetermined frequency range from a detection signal in a predetermined segment. An expectation calculation circuit (202) calculates a second frequency spectrum corresponding to an expectation signal of a pattern of digital information that is present in the predetermined segment and obtained via an optical disc (100). A branch metric calculation circuit (203) calculates a difference between the first frequency spectrum and the second frequency spectrum. A maximum likelihood decoding circuit (207) decodes the digital information by selecting a pattern in which the difference between the first frequency spectrum and the second frequency spectrum is minimized as a decoding result.

8 Claims, 13 Drawing Sheets

DECODING METHOD AND DECODING DEVICE

TECHNICAL FIELD

The present invention relates to a decoding method and a decoding device for decoding digital information based on a reproduced signal detected from a recording medium such as an optical disc or a reception signal received via a communication medium such as an optical fiber.

BACKGROUND ART

In recent years, with an increase in the recording density of optical discs, the length of the shortest recording mark is nearing the limit of optical resolution, and an increase in intersymbol interference and deterioration of signal-noise ratio (SNR) have become more noticeable. Therefore, a partial response maximum likelihood (PRML) scheme is generally used as a signal processing method.

The PRML scheme is a technique that combines partial response (PR) and maximum likelihood (ML) decoding and is a method of selecting a most probable signal sequence from a reproduced waveform on the assumption that known intersymbol interference occurs. Thus, it is known that decoding performance is improved as compared to a conventional level determination method.

Signals reproduced from an optical disc are subjected to partial-response equalization using a waveform equalizer, a digital filter, and the like so as to have predetermined frequency characteristics and are then decoded into corresponding binary data by selecting a most probable state transition sequence using the Viterbi decoding or the like. A value "L" that indicates a probability where a state transitions to a state "Sn" (n is a state number) until time "k" is defined by Expression (1) below.

$$L = \sum_{i=0}^{k} (y_i - E_i)^2 \quad (1)$$

In Expression (1), "$y_i$" is the value of a reproduced signal at time "i", and "$E_i$" is the value of an expected ideal reproduced signal. In the maximum likelihood decoding scheme, such a state transition sequence that the value "L" indicating the probability obtained by Expression (1) is minimized is selected and is decoded into corresponding to binary data (for example, see Patent Literature 1).

As the increase in the density of optical discs progresses further, the deterioration of intersymbol interference and SNR causes severe problems. Reproduction performance can be maintained by using higher-order PRML schemes. For example, when the storage capacity per recording layer of a 12-cm optical disc is 25 GB, good reproduction performance can be maintained by employing a PR(1,2,2,1) ML scheme. On the other hand, when the storage capacity per layer is 33.3 GB, it is necessary to employ a PR(1,2,2,2,1) ML scheme. Actually, BDXL of which the storage capacity per layer is 33.4 GB is already in practical use, and a PR(1,2,2,2,1) ML scheme is employed (for example, see Non Patent Literature 1).

Moreover, high-speed optical communication techniques have been developed in order to deal with an abrupt increase in information traffic. With the increase in the information traffic, the input optical power has been increasing remarkably and optical communication techniques have reached the physical limit of optical fibers where nonlinear optical effect, thermal destruction, and the like occur. In order to improve optical communication efficiency, optical wavelength multiplex modulation schemes which use light having multiple wavelengths and techniques for improving the performance of dispersion compensation fibers that compensate for distortion resulting from dispersion of an optical signal waveform occurring due to propagation characteristics of optical fibers or the performance of optical fibers such as optical amplifiers, which mainly become transmitters and transmission paths are gathering attention.

The PRML scheme used in the optical discs assumes that reproduced signals can be equalized so as to have a predetermined frequency characteristic.

FIG. 12 is a diagram showing an optical transfer function (OTF) of BDXL and the frequency characteristics of PR(1,2,2,2,1). The OTF gain becomes zero when a normalized frequency is 0.23. In contrast, the gain of the PR(1,2,2,2,1) characteristics becomes zero temporarily when the normalized frequency is 0.25 and becomes higher than zero in a frequency range where the normalized frequencies are higher than 0.25. The reproduced signal is equalized by a waveform equalizer so as to have the PR(1,2,2,2,1) characteristics. In this case, since the OTF gain is larger than zero in a frequency range where the normalized frequencies are smaller than 0.23, it is possible to equalize the reproduced signal. However, since the OTF gain is zero in a frequency range where the normalized frequencies are 0.23 or higher, it is not possible to amplify the amplitude characteristics of the reproduced signal.

FIG. 13 is a diagram showing the waveform of an ideal signal having the PR(1,2,2,2,1) characteristics and the waveform of a reproduced signal of BDXL equalized with a waveform equalizer. As shown in FIG. 13, since it is not possible to equalize signal components in a frequency range where the normalized frequencies are higher than 0.23, an error always remains in the amplitude values of the ideal signal and the equalized reproduced signal. Thus, even when a noise component applied to the reproduced signal is zero, the value "L" indicating the probability of state transitions shown in Expression (1) does not become zero, and the error causes deterioration of the decoding performance of the PRML scheme. Such deterioration of the decoding performance is called distortion deterioration. In the PR(1,2,2,2,1) characteristics shown in FIG. 12, signal components of which the normalized frequencies are higher than 0.23 and which result in distortion deterioration take approximately 11% of all signal components of the PR(1,2,2,2,1) characteristics.

FIG. 14 is a diagram showing an optical transfer function of an optical disc of which the linear recording density is twice that of BDXL and the frequency characteristics of the PR(1,2,3,3,3,3,3,3,2,1) characteristics suited for this optical disc. The OTF gain becomes zero when the normalized frequency is 0.11. The gain of the PR(1,2,3,3,3,3,3,3,2,1) characteristics becomes zero temporarily when the normalized frequency is 0.11 similarly to the OTF gain and becomes higher than zero in a frequency range where the normalized frequencies are higher than 0.11. In this case, signal components which result in distortion deterioration take approximately 19% of all signal components of the PR(1,2,3,3,3,3,3,3,2,1) characteristics, and the influence of distortion deterioration increases nearly twice as compared to when the PR(1,2,2,2,1) characteristics were applied to the linear recording density of the BDXL.

FIG. 15 is a diagram showing an optical transfer function of an optical disc of which the linear recording density is twice that of BDXL and the frequency characteristics of PR(1,2,3, 4,5,6,6,6,5,4,3,2,1) characteristics in which the gain in a high frequency range where the normalized frequencies are 0.11 or higher is decreased. Due to the decreased gain in the high frequency range, although signal components which result in distortion deterioration can be reduced up to approximately 7% of all signal components, it is not possible to make distortion deterioration zero.

In order to make distortion deterioration zero, a target PR class needs to have exactly the same frequency characteristics as those of OTF. However, since the OTF always changes depending on the reproduction conditions, if the PR class is determined to have a single frequency characteristic, distortion deterioration occurs. That is, it can be said that equalization of a reproduced signal to a frequency characteristic of a predetermined PR class becomes the cause of distortion deterioration.

Moreover, a waveform equalizer amplifies a signal amplitude so that the frequency characteristic of a reproduced signal approaches the frequency characteristic of a set PR class. In this case, the amplification factor in a high frequency range is likely to increase in order to equalize the errors in a frequency range higher than the normalized frequency at which the OTF gain becomes zero. As a result, the noise component in the high frequency range of the reproduced signal is amplified too much, and the decoding performance of the PRML scheme is deteriorated.

As described above, in the conventional PRML scheme, there is a problem in that as with the increase in the density of optical discs, the decoding performance deteriorates due to the influence of distortion deterioration and amplification of noise components in the high frequency range, and it is not possible to reproduce data recorded on an optical disc.

Moreover, the efficiency of optical communication has been improved using the above-described optical wavelength multiplex modulation scheme, dispersion compensation fibers, optical amplifiers, and the like. Further, in addition to this, a communication speed can be increased by increasing an optical modulation speed to use a broader frequency range in order to increase the amount of information transmitted per wavelength of light. However, in order to accurately receive the waveform of an optical signal modulated using a broader frequency range, it is necessary to improve an optical detector used in a receiver. An optical detector converts a received optical signal waveform into an electrical signal. In an optical detector, the frequency range where optical signals can be efficiently converted is limited. Thus, there is a problem in that even when an optical modulator on the transmitter side modulates signals using a broad frequency range, the optical detector cannot detect the signals sufficiently, and the use of the broad frequency range becomes an obstacle to improvement of the communication speed. Moreover, although this problem can be solved by increasing the sensitivity of the optical detector, there is a problem in that the size of the optical detector increases and the power consumption also increases.

CITATION LIST

Patent Literature

Patent Literature 1: Japanese Patent Application Publication No. 2003-141823

Non Patent Literature

Non Patent Literature 1: Blu-ray Disc Association, "White Paper Blu-ray Disc Format: 1. A Physical Format Specifications for BD-RE," October 2010

SUMMARY OF THE INVENTION

The present invention has been made to solve the above problems, and an object of the present invention is to provide a decoding method and a decoding device capable of suppressing deterioration of decoding performance and reliably decoding digital information.

A decoding method according to an aspect of the present invention is a decoding method for decoding digital information based on a detection signal obtained from a medium having a predetermined frequency characteristic, including: a first frequency spectrum calculation step of calculating a first frequency spectrum in a predetermined frequency range from the detection signal in a predetermined segment; a second frequency spectrum calculation step of calculating a second frequency spectrum corresponding to an expectation signal of a pattern of the digital information that is present in the predetermined segment and obtained via the medium; a frequency spectrum difference calculation step of calculating a difference between the first frequency spectrum and the second frequency spectrum; and a decoding step of decoding the digital information by selecting a pattern in which the difference between the first frequency spectrum and the second frequency spectrum is minimized as a decoding result.

According to this configuration, in the first frequency spectrum calculation step, the first frequency spectrum in a predetermined frequency range is calculated from the detection signal in a predetermined segment. In the second frequency spectrum calculation step, the second frequency spectrum corresponding to an expectation signal of a pattern of the digital information that is present in the predetermined segment and obtained via the medium is calculated. In the frequency spectrum difference calculation step, the difference between the first frequency spectrum and the second frequency spectrum is calculated. In the decoding step, the digital information is decoded by selecting a pattern in which the difference between the first frequency spectrum and the second frequency spectrum is minimized as a decoding result.

According to the present invention, the difference between the first frequency spectrum in the predetermined frequency range and the second frequency spectrum corresponding to the expectation signal of the pattern of the digital information that is present in the predetermined segment and obtained via the medium is calculated, and the pattern in which the calculated difference is minimized is selected as the decoding result. Thus, even when the frequency characteristic of the medium is present in a frequency range where the gain of the optical transfer function is absent, it is possible to efficiently decode signals from only the frequency characteristic in a low frequency range where the gain of the optical transfer function is zero or higher, to suppress deterioration of the decoding performance, and to reliably decode the digital information.

The objects, features, and advantages of the present invention will become more apparent from the following detailed description in conjunction with the accompanying drawings.

DESCRIPTION OF EMBODIMENTS

Hereinafter, embodiments of the present invention will be described with reference to the accompanying drawings. The following embodiments are examples that embody the present invention and do not limit the technical scope of the present invention.

First Embodiment

Figure 1:
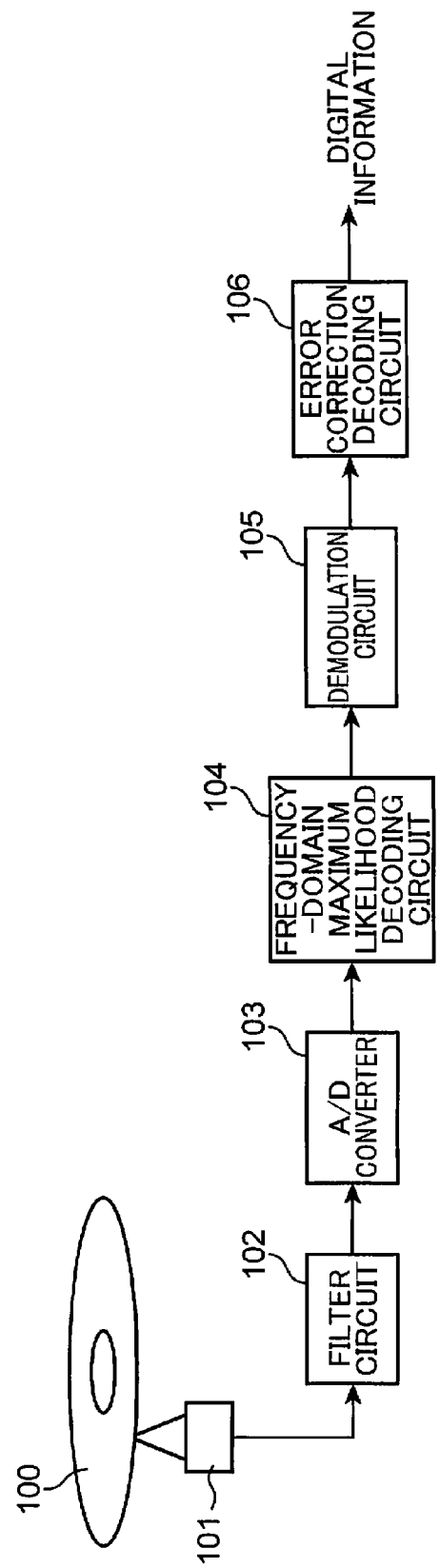
FIG. 1 is a diagram showing a configuration of an optical disc device according to a first embodiment of the present invention.

FIG. 1 is a diagram showing a configuration of an optical disc device according to a first embodiment of the present invention. FIG. 1 shows the configuration of portions associated with a processing system that reproduces digital information from an optical disc 100. The optical disc device shown in FIG. 1 includes an optical pickup 101, a filter circuit 102, an A/D converter 103, a frequency-domain maximum likelihood decoding circuit 104, a demodulation circuit 105, and an error correction decoding circuit 106.

A recording mark is formed on a track of the optical disc 100 according to a recording code obtained by performing predetermined error correction encoding and modulation encoding on digital information. A reproduction process of reproducing the recorded digital information is performed by taking advantage of the change in the amount of reflected light with respect to a laser beam irradiated to a track from the optical pickup 101 according to the recording mark formed in the track.

The optical pickup 101 irradiates a laser beam to the optical disc 100 and receives light reflected from the optical disc 100. The optical pickup 101 detects a reproduced signal corresponding to the amount of reflected light. The filter circuit 102 reduces noise components in the low and high frequency ranges in such a range that no adverse effect is caused on the components in the frequency range of a modulation code included in the reproduced signal detected by the optical pickup 101. The A/D converter 103 converts the signal output from the filter circuit 102 into a digital signal that is sampled at intervals of one channel bit which is the unit of modulation codes.

The frequency-domain maximum likelihood decoding circuit 104 decodes the digital signal into a recording code recorded in the track using the frequency characteristics of the digital signal in a time domain. The demodulation circuit 105 demodulates the decoded recording code into a bit stream before the modulation encoding according to the modulation code. The error correction decoding circuit 106 corrects errors included in the bit stream demodulated by the demodulation circuit 105 according to an error correction code and outputs digital information.

Next, among the constituent components of the optical disc device, the frequency-domain maximum likelihood decoding circuit 104 that decodes a recording code from a digital signal will be described in detail.

Figure 2:
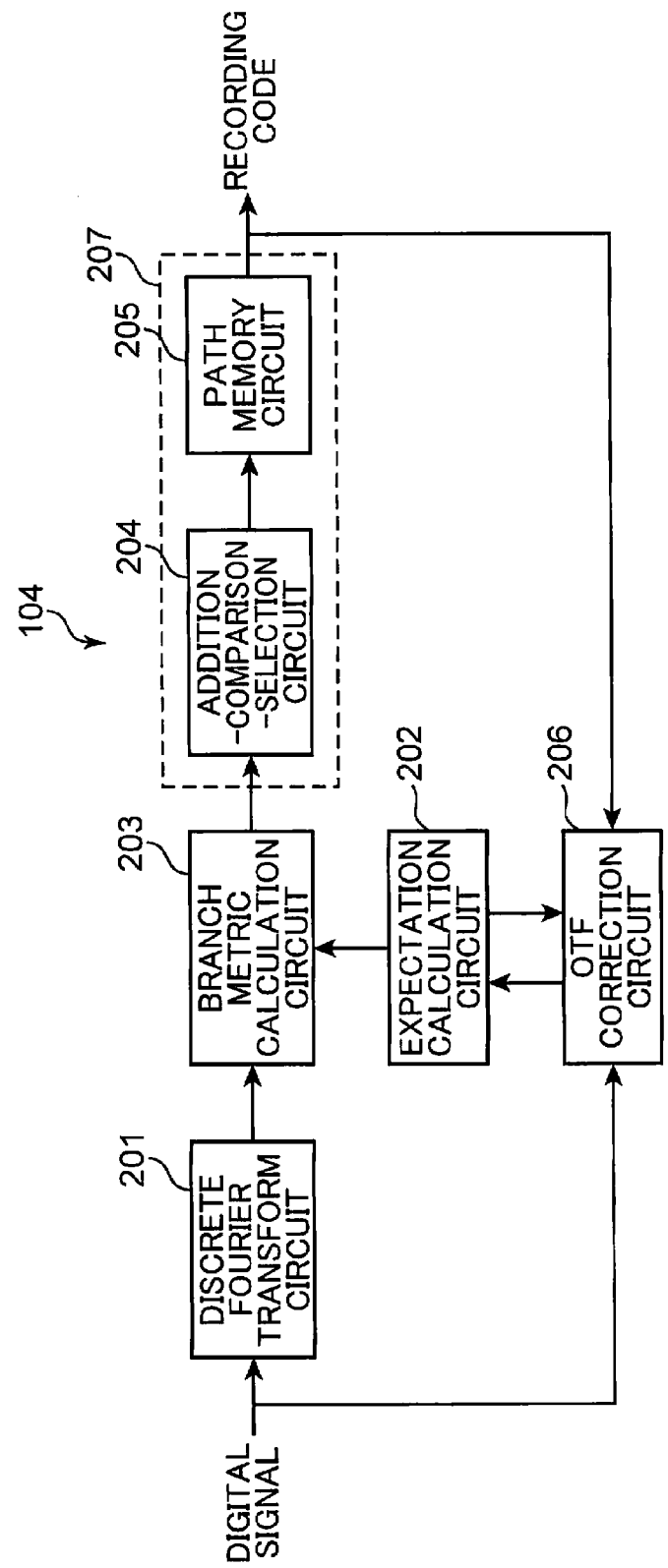
FIG. 2 is a block diagram showing a detailed configuration of a frequency-domain maximum likelihood decoding circuit shown in FIG. 1.

FIG. 2 is a block diagram showing a detailed configuration of the frequency-domain maximum likelihood decoding circuit shown in FIG. 1. The frequency-domain maximum likelihood decoding circuit 104 shown in FIG. 2 includes a discrete Fourier transform circuit 201, an expectation calculation circuit 202, a branch metric calculation circuit 203, an addition-comparison-selection circuit 204, a path memory circuit 205, and an OTF correction circuit 206.

The digital signal output from the A/D converter 103 is input to the discrete Fourier transform circuit 201 of the frequency-domain maximum likelihood decoding circuit 104. The discrete Fourier transform circuit 201 calculates a frequency spectrum (first frequency spectrum) in a predetermined frequency range from detection signals (digital signals) in a predetermined segment. The discrete Fourier transform circuit 201 holds N samples of digital signals, performs N-point discrete Fourier transform on a digital signal stream held for each channel bit, and outputs a frequency spectrum "$I_k$" (k=0 to N−1). The number of sampling points "N" is preferably larger than a spreading width (intersymbol interference width) of a reproduced signal with respect to the recording mark corresponding to one channel bit. For example, when the size of the recording mark corresponding to one channel bit is ½ that of BDXL, the number of sampling points "N" is preferably 16 or more.

The expectation calculation circuit 202 performs N-point discrete Fourier transform with respect to each of expectation codes that are present at intervals of N-channel bit length to calculate a frequency spectrum "$S_k$" and multiplies the calculated frequency spectrum "$S_k$" with an OTF frequency characteristic "$O_k$". In this manner, the expectation calculation circuit 202 calculates the frequency spectrum "$E_k$" (=$S_k \times O_k$) of an expectation signal when the expectation code was reproduced. The expectation calculation circuit 202 calculates the frequency spectrum "$E_k$" (second frequency spectrum) corresponding to an expectation signal of a digital information pattern that is present in a predetermined segment and obtained via the optical disc 100. The expectation calculation circuit 202 outputs the calculated frequency spectrum "$E_k$" of the expectation signal to the branch metric calculation circuit 203.

The branch metric calculation circuit 203 calculates branch metrics corresponding to the distance between the frequency spectrum "$I_k$" of the digital signal and the frequency spectrum "$E_k$" of each expectation signal. The branch metrics are calculated from frequency spectra in a frequency range where the OTF gain is larger than zero. The branch metric calculation circuit 203 calculates a difference between the frequency spectrum "$I_k$" (first frequency spectrum) in a predetermined frequency range and the frequency spectrum "$E_k$" (second frequency spectrum) corresponding to the expectation signal.

The branch metric calculation circuit 203 calculates, for each frequency, a squared value of the difference between a real part of the frequency spectrum "$I_k$" of the digital signal and a real part of the frequency spectrum "$E_k$" of the expectation signal and a squared value between the difference between an imaginary part of the frequency spectrum "$I_k$" and an imaginary part of the frequency spectrum "$E_k$" and calculates the sum of the squared value of the difference between the real parts and the squared value of the difference between the imaginary parts in a predetermined frequency range as the difference between the frequency spectrum "$I_k$" and the frequency spectrum "$E_k$".

Moreover, the branch metric calculation circuit 203 calculates the difference between the frequency spectrum "$I_k$" and the frequency spectrum "$E_k$" in a frequency range where a gain of a predetermined value or higher is obtained for predetermined frequency characteristics of the optical disc 100.

The maximum likelihood decoding circuit 207 decodes the digital information based on the difference between the frequency spectrum "$I_k$" (first frequency spectrum) of the digital signal and the frequency spectrum "$E_k$" (second frequency spectrum) of the expectation signal. The maximum likelihood decoding circuit 207 decodes the digital information by selecting such a pattern that the difference between the frequency spectrum "$I_k$" and the frequency spectrum "$E_k$" becomes smallest as a decoding result. The maximum likelihood decoding circuit 207 selects an expectation code in which the distance (error) between the frequency spectrum "$I_k$" of the digital signal and the frequency spectrum "$E_k$" of the expectation signal is smallest and outputs the selected expectation code as a decoded recording code of the digital signal.

The maximum likelihood decoding circuit 207 includes the addition-comparison-selection circuit 204 and the path memory circuit 205. As shown in FIG. 2, a Viterbi decoding circuit that decodes digital information using the Viterbi algorithm can be realized by the branch metric calculation circuit 203 and the maximum likelihood decoding circuit 207.

Figure 3:
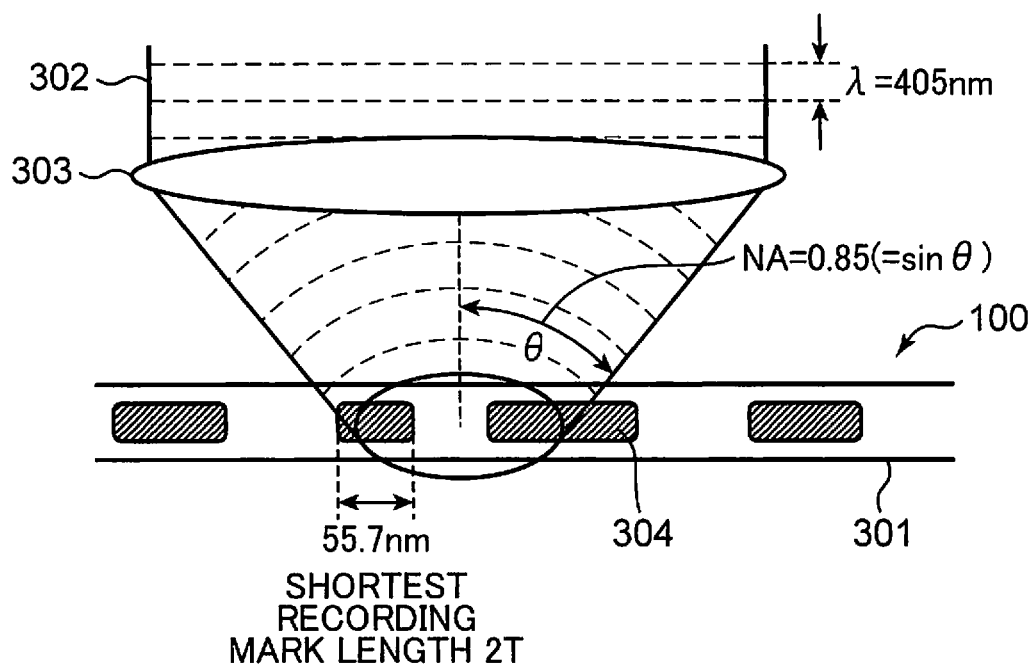
FIG. 3 is a diagram showing a state where a laser beam is irradiated from an optical pickup to a track of an optical disc.

FIG. 3 is a diagram showing a state where a laser beam 302 is irradiated from an optical pickup to a track 301 of the optical disc 100. The laser beam 302 is condensed by an objective lens 303 and is irradiated to the track 301 of the optical disc 100. A recording mark 304 is formed on the track 301. The size of the recording mark 304 corresponding to one channel bit is ½ (27.9 nm) that of BDXL, and a smallest recording mark length 2 T is 55.7 nm. The wavelength $\lambda$ of the laser beam 302 is 405 nm, a numerical aperture NA of the objective lens 303 is 0.85, and the diffraction limit is 238.2 nm (=$\lambda$/(2·NA)). The diffraction limit is the magnitude at the boundary where a change in the amplitude of a reproduced signal according to the amount of reflected light does not occur, and amounts to approximately 8.5 channel bits when it is normalized by 27.9 nm which is one channel bit length. A reciprocal of the diffraction limit is a normalized frequency at which the OTF gain becomes zero, and in this case, the normalized frequency becomes 0.11.

That is, the predetermined frequency range used in the branch metric calculation circuit 203 is a frequency range that is lower than the normalized frequency (2·NA·T)/$\lambda$ when the length of one channel in which digital information is recorded is denoted as T, the wavelength of light irradiated to the optical disc is denoted as $\lambda$, and the numerical aperture of an objective lens that condenses light onto the optical disc is denoted as NA.

Figure 4:
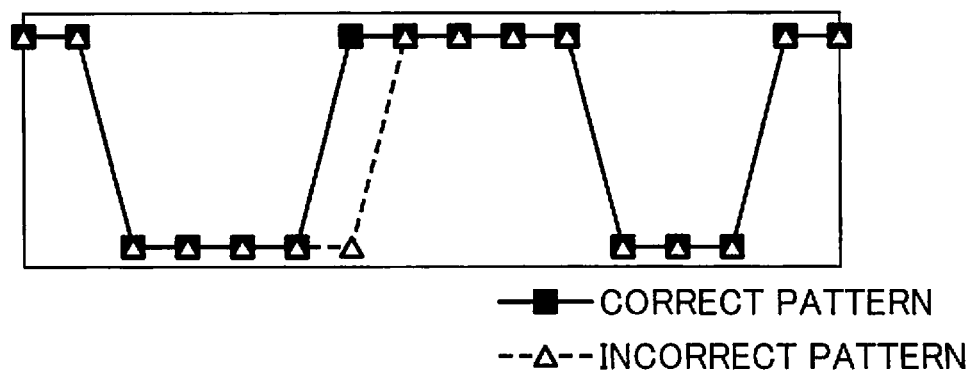
FIG. 4 is a diagram showing a correct pattern of a recording code an incorrect pattern of the recording code, of which only one bit value is different from that of the correct pattern.
Figure 5:
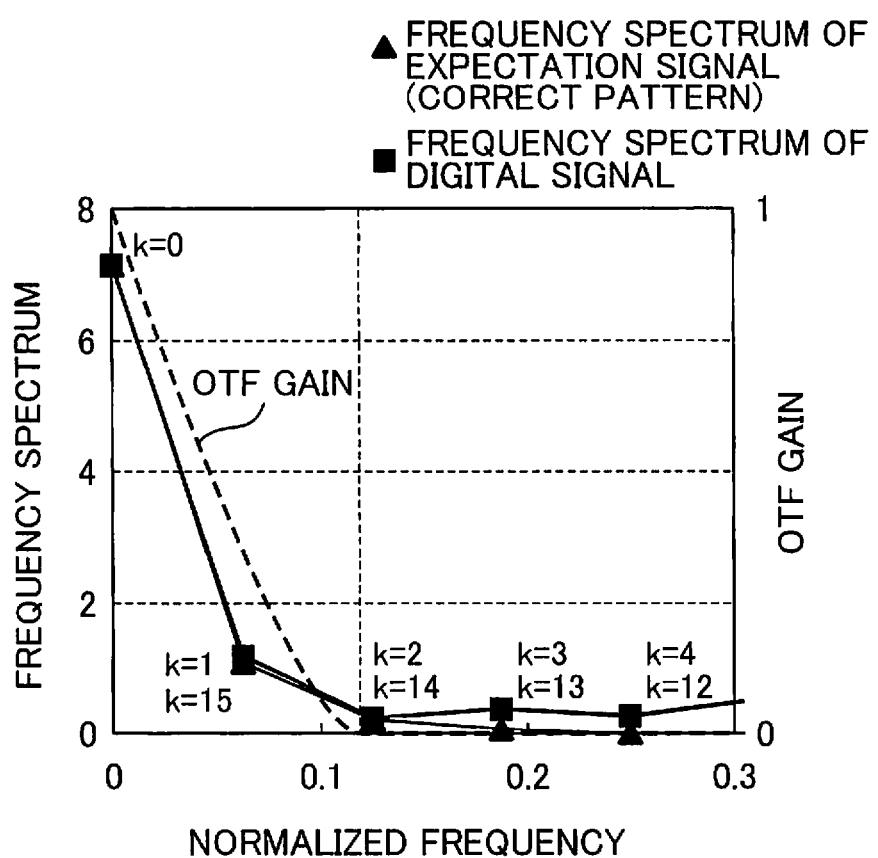
FIG. 5 is a diagram showing a frequency spectrum of a digital signal and a frequency spectrum of an expectation signal of the correct pattern shown in FIG. 4.
Figure 6:
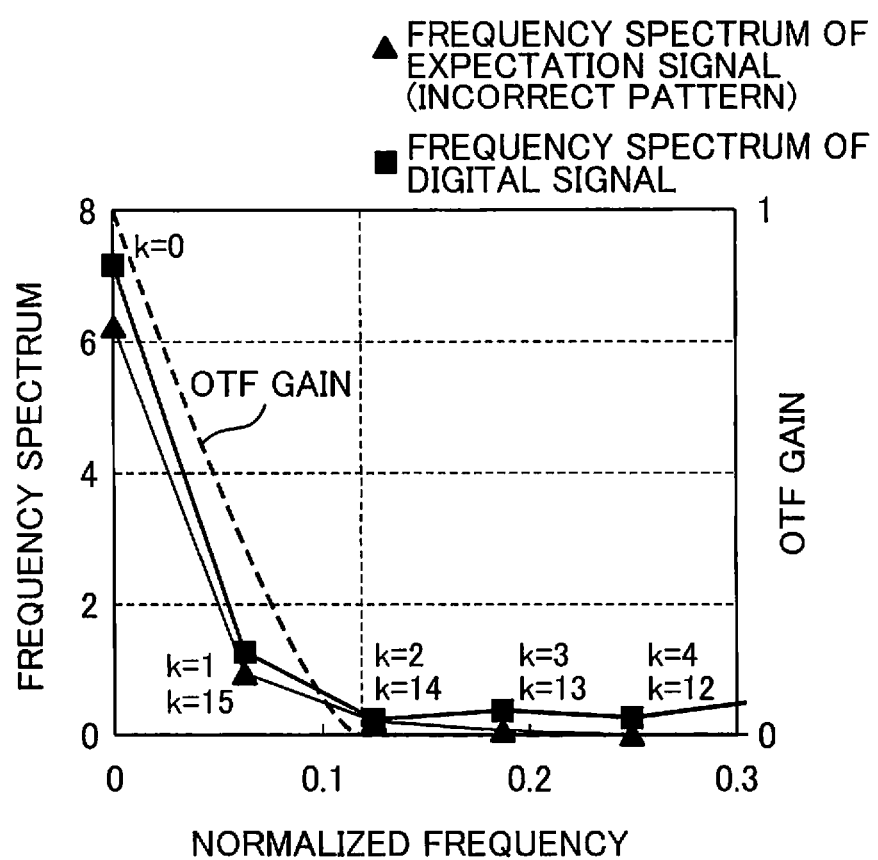
FIG. 6 is a diagram showing a frequency spectrum of a digital signal and a frequency spectrum of an expectation signal of the incorrect pattern shown in FIG. 4, of which only one bit value is different.

FIGS. 4 to 6 show calculation examples of branch metrics when the size of a recording mark of one channel bit is ½ that of BDXL and the number of sampling points "N" is 16. FIG. 4 is a diagram showing a correct pattern of a recording code and an incorrect pattern of a recording code of which only one bit value is different from that of the correct pattern. FIG. 5 is a diagram showing a frequency spectrum "$I_k$" of a digital signal and a frequency spectrum "$E_k$" of an expectation signal of the correct pattern shown in FIG. 4.

The OTF gain becomes zero when the normalized frequency is 0.11 or higher. Thus, since signal components corresponding to a recording code pattern are obtained at the three points of k=0, k=1, and k=15, and the OTF gain is zero at the other twelve points, the frequency spectrum of the expectation signal is zero. However, the frequency spectrum "$I_k$" of the digital signal is in such a state that the signal components corresponding to the recording codes recorded on the optical disc 100 and the noise components present in all frequency ranges are added. Thus, the signal component is zero in a high frequency range where the OTF gain is zero, and only the noise components remain. Therefore, the frequency spectrum "$I_k$" of the digital signal and the frequency spectrum "$E_k$" of the expectation signal are approximately identical in the frequency range where the normalized frequencies are 0.11 or lower, and the values of two frequency spectra corresponding to the noise components are separated in a frequency range where the normalized frequencies are higher than 0.11.

FIG. 6 is a diagram showing the frequency spectrum "$I_k$" of the digital signal and the frequency spectrum "$E_k$" of the expectation signal of the incorrect pattern shown in FIG. 4, of which only one bit value is different. In a frequency range where the normalized frequencies are 0.11 or lower, a difference in the frequency spectrum corresponding to the difference in the recording code pattern is present. In a frequency range where the normalized frequencies are higher than 0.11, the values of two frequency spectra corresponding to the noise components are separated similarly to the correct pattern shown in FIG. 5.

From the above, in calculation of branch metrics, it can be understood that it is ideal to use only the values at the three points of k=0, k=1, and k=15 present in the frequency range where a difference in the recording code pattern is present and the normalized frequencies are 0.11 or lower and to do not use the values at the other points. The branch metric "M" can be calculated based on Expression (2) below for each expectation code. In Expression (2), Re[a] represents the value of a real part of a complex number "a" and Im[a] represents the value of an imaginary part of the complex number "a".

$$M = (Re[E_0] - Re[I_0])^2 + (Im[E_0] - Im[I_0])^2 + (Re[E_1] - Re[I_1])^2 + (Im[E_1] - Im[I_1])^2 + (Re[E_{15}] - Re[I_{15}])^2 + (Im[E_{15}] - Im[I_{15}])^2 \qquad (2)$$

For example, when the branch metrics are calculated for the digital signals having the frequency spectra shown in FIGS. 4 to 6, if there is no noise component, the branch metric between the frequency spectrum of an expectation signal of a correct pattern and the frequency spectrum of a digital signal is 0, the branch metric between the frequency spectrum of the expectation signal of the incorrect pattern and the frequency spectrum of the digital signal is 1.23, and the difference thereof is 1.23. If there is a certain level of noise, the branch metric between the frequency spectrum of the expectation signal of the correct pattern and the frequency spectrum of the digital signal is 0.14, which becomes an influence of approximately 12% of the difference between the correct pattern and the incorrect pattern.

On the other hand, as for the same digital signals, in a PRML scheme having the PR(1,2,3,4,5,6,6,6,5,4,3,2,1) characteristics, if there is no noise component, the branch metric between the frequency spectrum of the expectation signal of the correct pattern and the frequency spectrum of the digital signal is 0.037, the branch metric between the frequency spectrum of the expectation signal of the incorrect pattern and the frequency spectrum of the digital signal is 0.237, and the difference thereof is 0.2. As described above, due to distortion deterioration which cannot be equalized completely, the difference between the correct pattern and the incorrect pattern will not become 0. Further, if there is the same level of noise as described above, the branch metric between the frequency spectrum of the expectation signal of the correct pattern and the frequency spectrum of the digital signal is 0.068, which becomes a significant influence of approximately 34% of the difference between the correct pattern and the incorrect pattern.

In the conventional PRML scheme, since branch metrics are calculated based on an amplitude value in a time domain, it is not possible to separate noise components in a high frequency range. However, in the present embodiment, since branch metrics are calculated from the frequency spectra in an effective frequency range, noise components are separated, and S/N efficiency can be improved.

The branch metrics calculated by the branch metric calculation circuit 203 are input to the addition-comparison-selection circuit 204. The addition-comparison-selection circuit 204 adds a path metric "$P_{t-1}$" at all expectation code states "$X_{t-1}$" of one time before, connected to a current expectation code state "$X_t$" and a branch metric "$M_t$" corresponding to a branch to the expectation code state "$X_t$" to thereby calculate a path metric "$P_t$" at the expectation code state "$X_t$" of the current time. The addition-comparison-selection circuit 204 selects an expectation code state transition in which the calculated path metric "$P_t$" is minimized and stores the path metric "$P_t$". The addition-comparison-selection circuit 204 performs the same process repeatedly at the next time.

The path memory circuit 205 estimates a most probable expectation code state transition sequence in which the path metric selected by the addition-comparison-selection circuit 204 is minimized. The path memory circuit 205 outputs a decoded recording code of the digital signal.

The OTF correction circuit 206 corrects the OTF frequency characteristic "$O_k$" which changes depending on reproduction conditions such as a condensing state of the laser beam irradiated to the track of the optical disc 100 from the optical pickup 101 or the warp or tilt of the optical disc 100. The OTF correction circuit 206 corrects the frequency spectrum "$E_k$" of the expectation signal so that the difference between the frequency spectrum "$I_k$" (first frequency spectrum) of the digital signal and the frequency spectrum "$E_k$" (second frequency spectrum) of the expectation signal corresponding to the pattern selected by the path memory circuit 205 decreases. The OTF correction circuit 206 corrects the OTF frequency characteristic "$O_k$," and outputs the corrected OTF frequency characteristic "$O_k$" to the expectation calculation circuit 202. In this manner, the frequency spectrum "$E_k$" of the expectation signal is corrected.

The OTF correction circuit 206 receives the recording code serving as a decoding result. The OTF correction circuit 206 performs N-point discrete Fourier transform on the recording code output from the path memory circuit 205 to calculate the frequency spectrum "$R_k$" of the recording code and multiplies the calculated frequency spectrum "$R_k$" of the recording code with the OTF frequency characteristic "$O_k$" held in the expectation calculation circuit 202 to thereby calculate the frequency spectrum "$S_k$" ($=R_k \times O_k$) of the expectation signal. The OTF correction circuit 206 delays the digital signal by an amount corresponding to the circuit delay starting from the discrete Fourier transform circuit 201 to the output of the path memory circuit 205 so as to match the recording code, and performs N-point discrete Fourier transform on the digital signal output from the discrete Fourier transform circuit 201 to calculate a frequency spectrum "$J_k$" of the digital signal. Subsequently, the OTF correction circuit 206 calculates a difference "$D_k$" between the frequency spectrum "$J_k$" of the digital signal and the frequency spectrum "$S_k$" of the expectation signal based on Expression (3) below.

$$D_k = J_k - S_k \quad (3)$$

Moreover, when an actual OTF frequency characteristic at that time is "$Q_k$," the frequency spectrum "$J_k$" of the digital signal is expressed by Expression (4) below.

$$J_k = R_k \times Q_k \quad (4)$$

Based on Expressions (3) and (4) above, an error $Err_k$ of the OTF frequency characteristic at the current time is calculated by Expression (5) below.

$$Err_k = Q_k - O_k = D_k / R_k \quad (5)$$

The OTF correction circuit 206 can correct the OTF frequency characteristic by adding an error $Err_k$ multiplied with a predetermined gain α to the OTF frequency characteristic "$O_k$" so that the error $Err_k$ decreases. The OTF correction circuit 206 corrects the OTF frequency characteristic based on Expression (6) below.

$$O_{k+1} = O_k + \alpha \times Err_k \quad (6)$$

If the OTF correction circuit 206 described above does not operate, an error occurs in the branch metrics due to the difference between the actual OTF frequency characteristic that changes according to the constantly changing reproduction conditions and the OTF frequency characteristic "$O_k$" used in calculation of the branch metrics. However, since the OTF correction circuit 206 operates, the OTF frequency characteristic "$O_k$" always reflects the reproduction conditions, and the error of the branch metrics can be reduced.

Figure 7:
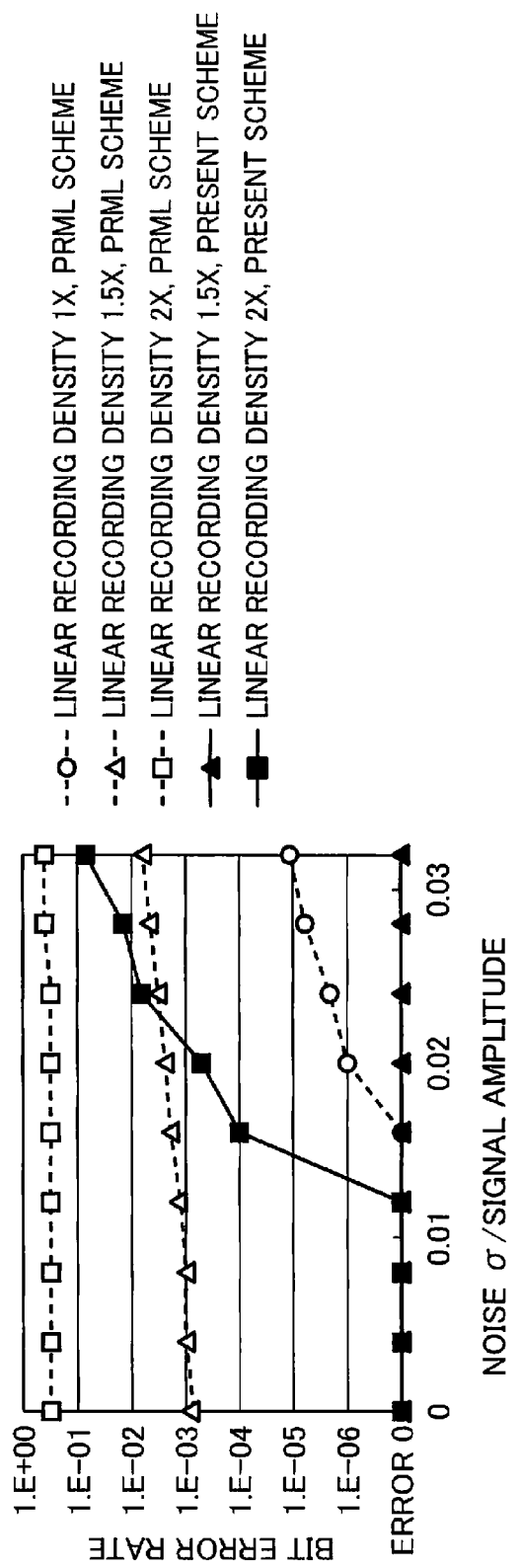
FIG. 7 is a diagram showing a bit error rate for linear recording density according to the first embodiment of the present invention.

An evaluation result of a bit error rate when signals are reproduced by the optical disc device described above will be described with reference to FIG. 7. FIG. 7 is a diagram showing the bit error rate for linear recording density according to the first embodiment of the present invention.

In the case of the conventional PRML scheme, although favorable reproduction performance is obtained with the linear recording density (1×) corresponding to BDXL, if the linear recording density becomes 1.5×, a bit error occurs due to the influence of distortion deterioration even when no noise occurs. Moreover, in the case of the conventional PRML scheme, it can be said that absolutely no signals are reproduced if the linear recording density becomes 2×. In contrast, in the optical disc device of the present embodiment, since distortion deterioration does not occur even when the linear recording density becomes 2×, no bit error occurs if there is no noise. Moreover, if a standard deviation "a" of noise is approximately 0.02 times the signal amplitude, it can be said that the bit error is of such a level that can be sufficiently corrected by the error correction decoding circuit 106.

As described above, even when the frequency characteristic of the recording code recorded on an optical disc is present in a frequency range where the OTF gain is absent, it is possible to efficiently decode signals from only the frequency characteristic in a low frequency range where the OTF gain is zero or higher and to further increase the density of the optical disc.

In the first embodiment, the optical disc 100 corresponds an example of a medium, the discrete Fourier transform circuit 201 corresponds to an example of a first frequency spectrum calculation unit, the expectation calculation circuit 202 corresponds to an example of a second frequency spectrum calculation unit, the branch metric calculation circuit 203 corresponds to an example of a frequency spectrum difference calculation unit, the maximum likelihood decoding circuit 207 corresponds to an example of a decoding unit, and the OTF correction circuit 206 corresponds to an example of a correction unit.

Second Embodiment

Figure 8:
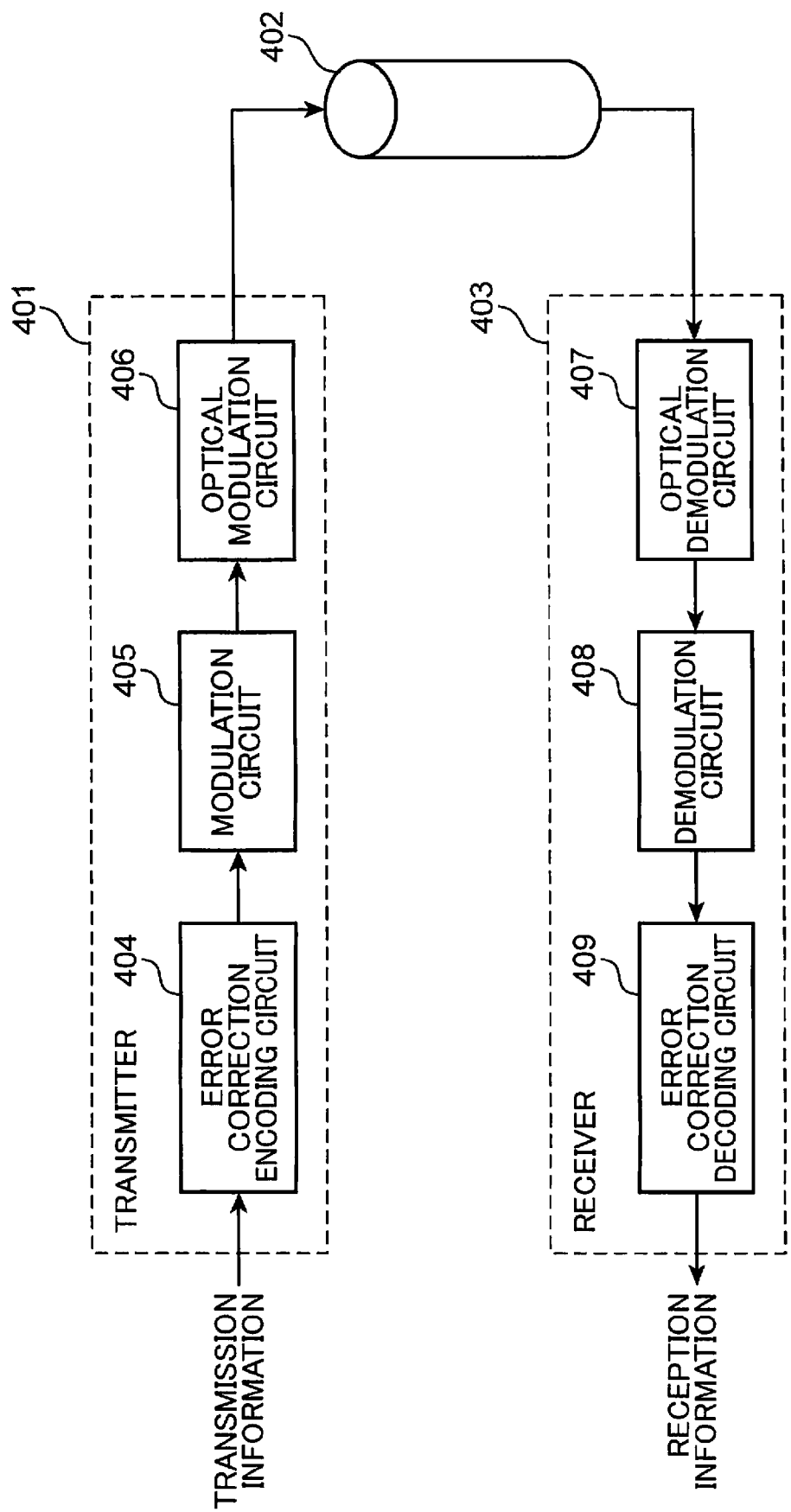
FIG. 8 is a diagram showing a configuration of an optical communication device according to a second embodiment of the present invention.

FIG. 8 is a diagram showing the configuration of an optical communication device according to a second embodiment of the present invention. The optical communication device includes a transmitter 401, an optical fiber 402, and a receiver 403.

The transmitter 401 that transmits transmission information includes an error correction encoding circuit 404, a modulation circuit 405, and an optical modulation circuit 406. The error correction encoding circuit 404 performs error-correction encoding on the transmission information to be transmitted. The modulation circuit 405 performs digital modulation on the error-correction encoded transmission information using a modulation scheme such as amplitude shift keying (ASK) or phase shift keying (PSK) and outputs the modulated transmission information as a digital code. The optical modulation circuit 406 generates an optical signal waveform of which the intensity of phase of the light of a predetermined wavelength is modulated according to the digital code and outputs the optical signal waveform to the optical fiber 402.

The optical fiber 402 transmits the optical fiber waveform output from the transmitter 401 to the receiver 403. The receiver 403 includes an optical demodulation circuit 407, a demodulation circuit 408, and an error correction decoding circuit 409. The optical demodulation circuit 407 detects the intensity or phase of the light transmitted by the optical fiber 402, converts the intensity or phase into an electrical signal, and decodes the digital code. The demodulation circuit 408 demodulates the digital code according to the modulation scheme such as amplitude shift keying (ASK) or phase shift keying (PSK) used in the modulation circuit 405. Further, the error correction decoding circuit 409 corrects errors occurring due to noise that is applied when light is transmitted by the optical fiber 402 and outputs reception information.

Figure 9:
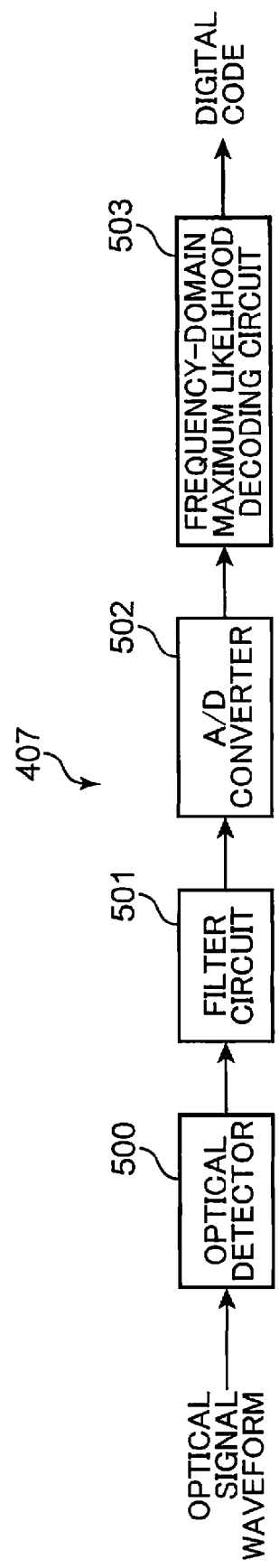
FIG. 9 is a block diagram showing a configuration of an optical demodulation circuit shown in FIG. 8.

Next, the optical demodulation circuit 407 of the receiver 403 will be described in detail. FIG. 9 is a block diagram showing the configuration of the optical demodulation circuit 407 shown in FIG. 8. The optical demodulation circuit 407 includes an optical detector 500, a filter circuit 501, an A/D converter 502, and a frequency-domain maximum likelihood decoding circuit 503.

Figure 10:
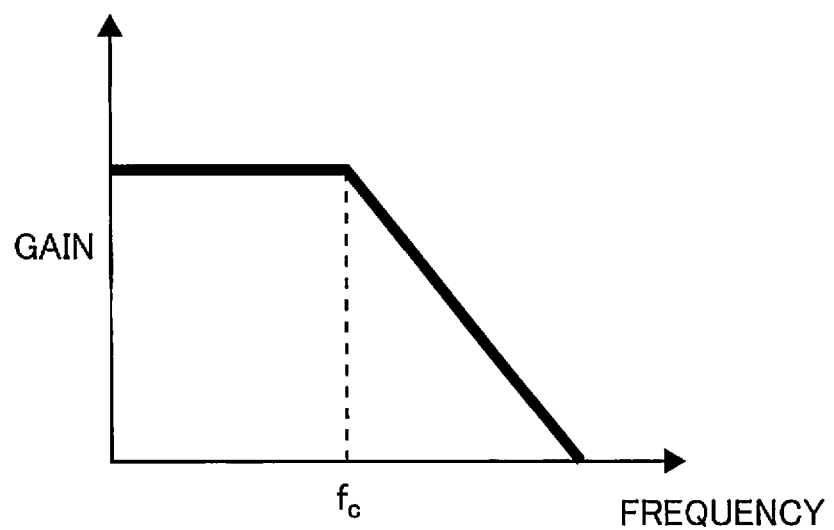
FIG. 10 is a diagram showing the frequency characteristics of photoelectric conversion of an optical detector according to the second embodiment of the present invention.

The optical signal waveform is input to the optical detector 500 which is configured as a photodetector or the like. The optical detector 500 photoelectrically converts the light transmitted by the optical fiber 402 to output an electrical signal. The photoelectric conversion performance has frequency characteristics. FIG. 10 is a diagram showing the frequency characteristics of the photoelectric conversion of the optical detector according to the second embodiment of the present invention. As shown in FIG. 10, the frequency characteristics of the photoelectric conversion of the optical detector 500 have low-pass characteristic. In order to increase the communication speed, the channel frequency used in the modulation of the modulation circuit 405 of the transmitter 401 is increased to be higher than twice the frequency "$f_C$" at which the gain of the frequency characteristic shown in FIG. 10 starts falling. In this case, similarly to the case of the optical disc device according to the first embodiment described above, intersymbol interference occurs such that a signal transmitted with one channel bit width is detected as a waveform having a width larger than one channel bit.

The electrical signal having intersymbol interference is input to the filter circuit 501. The filter circuit 501 reduces noise components in the low and high frequency ranges in such a range that no adverse effect is caused on the components in the frequency range of a modulation code included in the electrical signal. The A/D converter 502 converts the signal output from the filter circuit 501 into a digital signal that is sampled at intervals of one channel bit which is the unit of modulation codes. The frequency-domain maximum likelihood decoding circuit 503 decodes the digital signal into a digital code through which the digital signal is transmitted using the frequency characteristics of the digital signal in a time domain.

Figure 11:
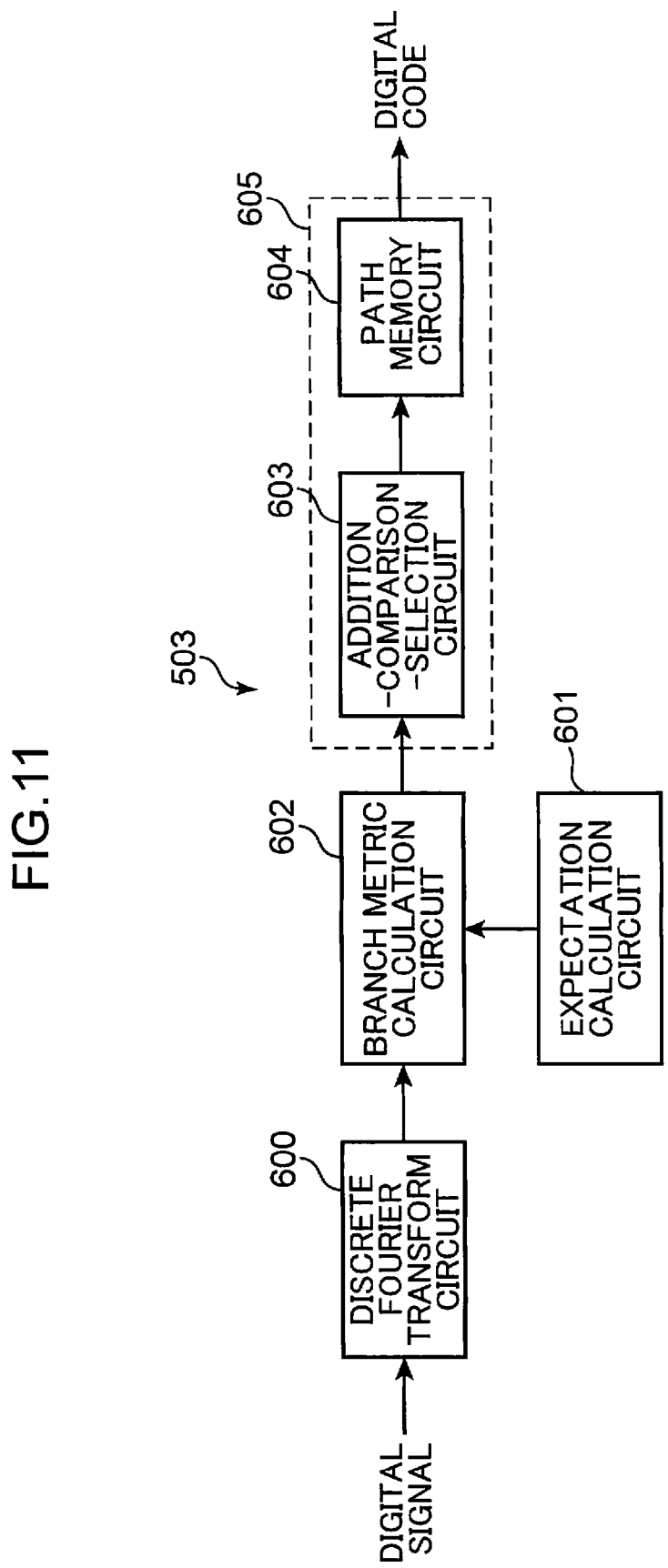
FIG. 11 is a block diagram showing a detailed configuration of a frequency-domain maximum likelihood decoding circuit shown in FIG. 9.
Figure 12:
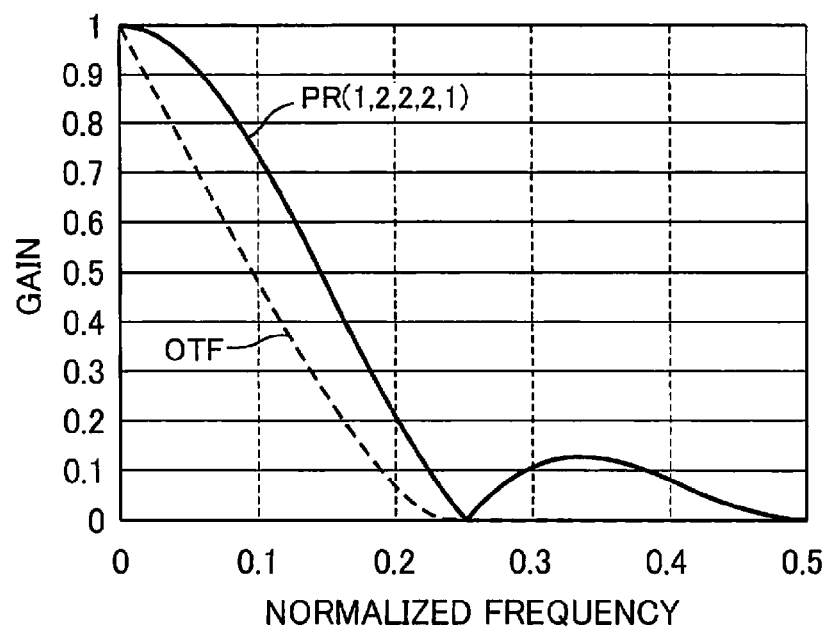
FIG. 12 is a diagram showing an optical transfer function of BDXL and the frequency characteristics of PR(1,2,2,2,1).
Figure 13:
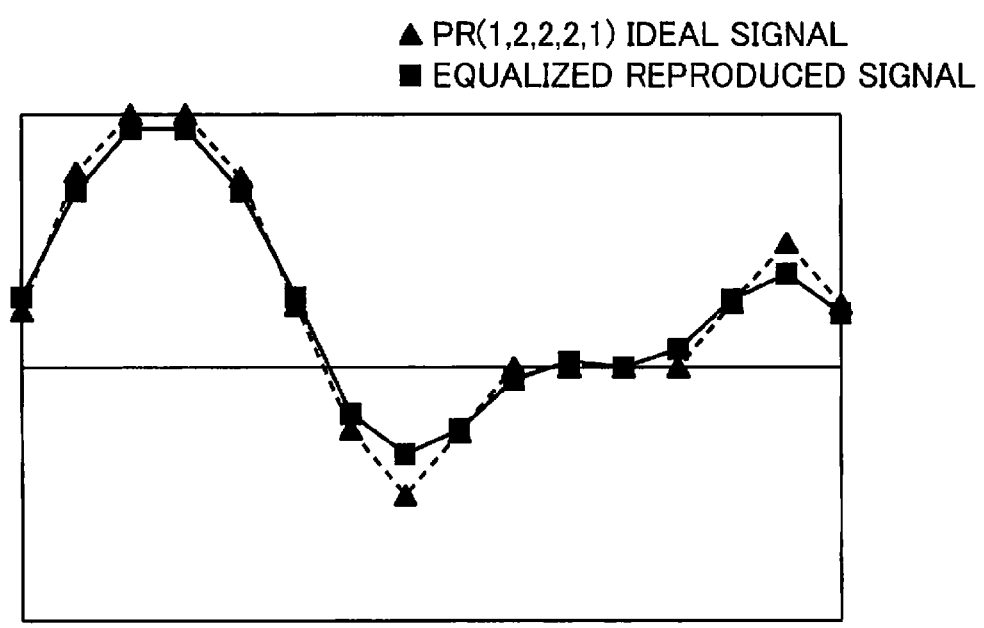
FIG. 13 is a diagram showing the waveform of an ideal signal having the PR(1,2,2,2,1) characteristics and the waveform of a reproduced signal of BDXL equalized with a waveform equalizer.
Figure 14:
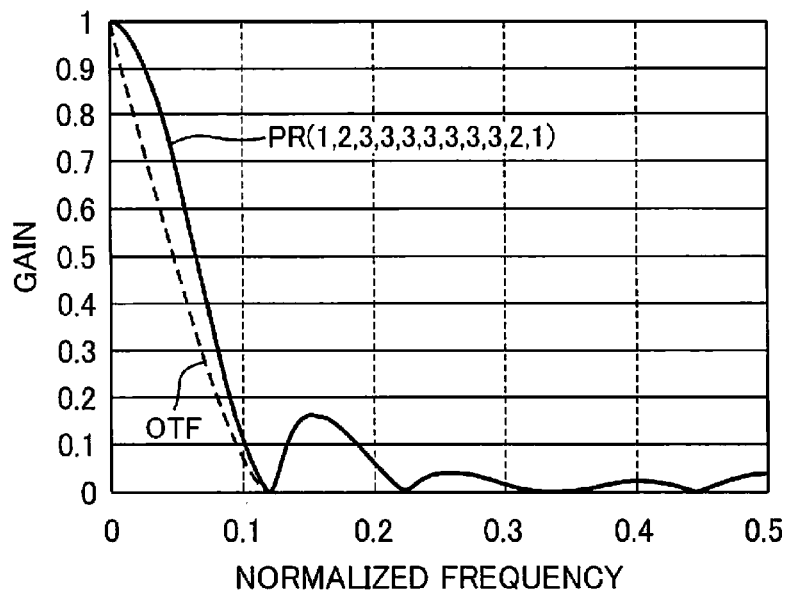
FIG. 14 is a diagram showing an optical transfer function of an optical disc of which the linear recording density is twice that of BDXL and the frequency characteristics of PR(1,2,3,3,3,3,3,3,2,1) characteristics suited for this optical disc.
Figure 15:
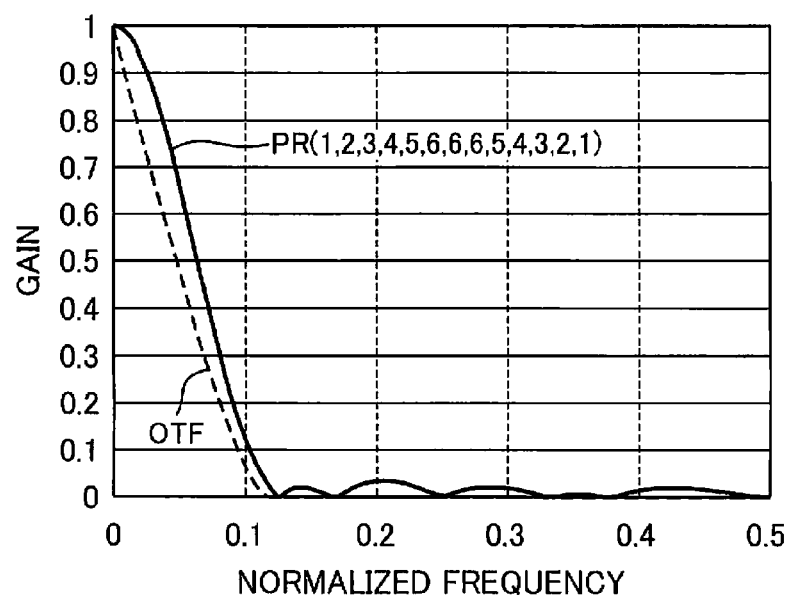
FIG. 15 is a diagram showing an optical transfer function of an optical disc of which the linear recording density is twice that of BDXL and the frequency characteristics of PR(1,2,3,4,5,6,6,6,5,4,3,2,1) characteristics in which the gain in a high frequency range where the normalized frequencies are 0.11 or higher is decreased.

FIG. 11 is a block diagram showing a detailed configuration of the frequency-domain maximum likelihood decoding circuit 503 shown in FIG. 9. The frequency-domain maximum likelihood decoding circuit 503 shown in FIG. 11 includes a discrete Fourier transform circuit 600, an expectation calculation circuit 601, a branch metric calculation circuit 602, an addition-comparison-selection circuit 603, and a path memory circuit 604.

The digital signal output from the A/D converter 502 is input to the discrete Fourier transform circuit 600 of the frequency-domain maximum likelihood decoding circuit 503. The discrete Fourier transform circuit 600 calculates a frequency spectrum (first frequency spectrum) in a predetermined frequency range from detection signals (digital signals) in a predetermined segment. The discrete Fourier transform circuit 600 holds N samples of digital signals, performs N-point discrete Fourier transform on a digital signal stream held for each channel bit, and outputs a frequency spectrum "$I_k$" (k=0 to N−1). The number of sampling points "N" is preferably larger than a spreading width of a reception signal with respect to a transmission signal corresponding to one channel bit.

The expectation calculation circuit 601 performs N-point discrete Fourier transform with respect to each of expectation codes that are present at intervals of N-channel bit length to calculate a frequency spectrum "$S_k$" and multiplies the calculated frequency spectrum "$S_k$" with the same frequency characteristic "$O_k$" of the photoelectric conversion of the optical detector 500 as shown in FIG. 10. In this manner, the expectation calculation circuit 601 calculates the frequency spectrum "$E_k$" ($=S_k \times O_k$) of an expectation signal when the expectation code was reproduced. The expectation calculation circuit 601 calculates a second frequency spectrum "$E_k$" (frequency spectrum) corresponding to an expectation signal of a digital information pattern that is present in a predetermined segment and obtained via the optical fiber 402. The expectation calculation circuit 601 outputs the calculated frequency spectrum "$E_k$" of the expectation signal to the branch metric calculation circuit 602.

The branch metric calculation circuit 602 calculates branch metrics corresponding to the distance between the frequency spectrum "$I_k$" of the digital signal and the frequency spectrum "$E_k$" of each expectation signal. The branch metrics are calculated from frequency spectra in a frequency range where the photoelectric conversion gain is a predetermined threshold value or higher. The branch metric calculation circuit 602 calculates a difference between the frequency spectrum "$I_k$" (first frequency spectrum) in a predetermined frequency range and the frequency spectrum "$E_k$" (second frequency spectrum) corresponding to the expectation signal.

The branch metric calculation circuit 602 calculates, for each frequency, a squared value of the difference between a real part of the frequency spectrum "$I_k$" of the digital signal and a real part of the frequency spectrum "$E_k$" of the expectation signal and a squared value of the difference between an imaginary part of the frequency spectrum "$I_k$" and an imaginary part of the frequency spectrum "$E_k$" and calculates the sum of the squared value of the difference between the real parts and the squared value of the difference between the imaginary parts in a predetermined frequency range as the difference between the frequency spectrum "$I_k$" and the frequency spectrum "$E_k$".

Moreover, the branch metric calculation circuit 602 calculates the difference between the frequency spectrum "$I_k$" and the frequency spectrum "$E_k$" in a frequency range where a gain of a predetermined value or higher is obtained for predetermined frequency characteristics of the optical fiber 402.

For example, when the number of sampling points "N" is 16 and the normalized frequency where the photoelectric conversion gain is a threshold value or higher is 0.25 or lower, the branch metric calculation circuit 602 uses the nine points of k=0, k=1, k=2, k=3, k=4, k=12, k=13, k=14, and k=15 in calculation of branch metrics. The branch metric "M" can be calculated based on Expression (7) below for each expectation code.

$$M=(Re[E_0]-Re[I_0])^2+(Im[E_0]-Im[I_0])^2+(Re[E_1]-Re[I_1])^2+(Im[E_1]-Im[I_1])^2+(Re[E_2]-Re[I_2])^2+(Im[E_2]-Im[I_2])^2+(Re[E_3]-Re[I_3])^2+(Im[E_3]-Im[I_3])^2+(Re[E_4]-Re[I_4])^2+(Im[E_4]-Im[I_4])^2+(Re[E_{12}]-Re[I_{12}])^2+(Im[E_{12}]-Im[I_{12}])^2+(Re[E_{13}]-Re[I_{13}])^2+(Im[E_{13}]-Im[I_{13}])^2+(Re[E_{14}]-Re[I_{14}])^2+(Im[E_{14}]-Im[I_{14}])^2+(Re[E_{15}]-Re[I_{15}])^2+(Im[E_{15}]-Im[I_{15}])_2 \quad (7)$$

The branch metrics calculated by the branch metric calculation circuit 602 are input to the addition-comparison-selection circuit 603. The addition-comparison-selection circuit 603 adds a path metric "$P_{t-1}$," at all expectation code states "$X_{t-1}$" of one time before, connected to a current expectation code state "$X_t$" and a branch metric "$M_t$" corresponding to a branch to the expectation code state "$X_t$" to thereby calculate a path metric "$P_t$" at the expectation code state "$X_t$" of the current time. The addition-comparison-selection circuit 603 selects an expectation code state transition in which the calculated path metric "$P_t$" is minimized and stores the path metric "$P_t$." The addition-comparison-selection circuit 603 performs the same process repeatedly at the next time.

The maximum likelihood decoding circuit 605 decodes the digital information based on the difference between the frequency spectrum "$I_k$" (first frequency spectrum) of the digital signal and the frequency spectrum "$E_k$" (second frequency spectrum) of the expectation signal. The maximum likelihood decoding circuit 605 decodes the digital information by selecting such a pattern that the difference between the frequency spectrum "$I_k$" and the frequency spectrum "$E_k$" becomes smallest as a decoding result. The maximum likelihood decoding circuit 605 selects an expectation code in which the distance (error) between the frequency spectrum "$I_k$" of the digital signal and the frequency spectrum "$E_k$" of the expectation signal is smallest and outputs the selected expectation code as a decoded recording code of the digital signal.

The maximum likelihood decoding circuit 605 includes the addition-comparison-selection circuit 603 and the path memory circuit 604. As shown in FIG. 11, a Viterbi decoding circuit that decodes digital information using the Viterbi algorithm can be realized by the branch metric calculation circuit 602 and the maximum likelihood decoding circuit 605.

The path memory circuit 604 estimates a most probable expectation code state transition sequence in which the path metric selected by the addition-comparison-selection circuit 603 is minimized. The path memory circuit 604 outputs a decoded digital code of the digital signal.

In this manner, decoding can be performed by taking advantage of the frequency range where the frequency characteristic of the photoelectric conversion of the optical detector 500 decreases, and the communication speed can be increased by increasing the channel frequency of the modulation circuit 405.

In the optical disc device of the first embodiment or the optical communication device of the second embodiment, although the branch metric calculation circuit 203 or the branch metric calculation circuit 602 uses the values of the real and imaginary parts of the frequency spectrum in calculation of the branch metrics as shown in Expression (2) or (7), the present invention is not limited to this. Even when the branch metric calculation circuit 203 or the branch metric calculation circuit 602 uses the values of the amplitude and phase of the frequency spectrum in calculation of branch metrics, the same advantages as above can be obtained.

Moreover, the branch metric calculation circuit 203 or the branch metric calculation circuit 602 may calculate, for each frequency, the absolute value of the difference between the real part of the first frequency spectrum and the real part of the second frequency spectrum and the absolute value of the difference between the imaginary part of the first frequency spectrum and the imaginary part of the second frequency spectrum and calculate the sum of the absolute value of the difference in the real part and the absolute value of the difference in the imaginary part in a predetermined frequency range as the difference between the first and second frequency spectra.

In the second embodiment, the optical fiber 402 corresponds to an example of a medium, the discrete Fourier transform circuit 600 corresponds to an example of a first frequency spectrum calculation unit, the expectation calculation circuit 602 corresponds to an example of a second frequency spectrum calculation unit, the branch metric calculation circuit 602 corresponds to an example of a frequency spectrum difference calculation unit, and the maximum likelihood decoding circuit 605 corresponds to an example of a decoding unit.

The constituent components of the optical disc device of the first embodiment or the optical communication device of the second embodiment can be realized as a large scale integration (LSI) circuit which is an integrated circuit. The constituent components included in the optical disc device or the optical communication device may be individually chips and may be partially or totally contained in a single chip.

In this example, although an integrated circuit is referred to as LSI, the integrated circuit may be referred to as integrated circuit (IC), LSI, super LSI, or ultra LSI depending on different levels of integration.

Moreover, the integrated circuits of the first and second embodiments are not limited to LSI circuits but may be realized as special-purpose circuits or general-purpose processors. Further, field programmable gate arrays (FPGA) which can be programmed after manufacturing LSI or reconfigurable processors capable of reconfiguring connections and settings of circuit cells in LSI circuits may be used.

Further, if circuit integration techniques which replace LSI technologies appear as a result of the progress of semiconductor technologies or other derivative technologies, it is naturally also possible to integrate function blocks using that technique. Application of biotechnology is also possible.

The inventions having the following features are mainly included in the above-described specific embodiments.

A decoding method according to an aspect of the present invention is a decoding method for decoding digital information based on a detection signal obtained from a medium having a predetermined frequency characteristic, including: a first frequency spectrum calculation step of calculating a first frequency spectrum in a predetermined frequency range from the detection signal in a predetermined segment; a second frequency spectrum calculation step of calculating a second frequency spectrum corresponding to an expectation signal of a pattern of the digital information that is present in the predetermined segment and obtained via the medium; a frequency spectrum difference calculation step of calculating a difference between the first frequency spectrum and the second frequency spectrum; and a decoding step of decoding the digital information by selecting a pattern in which the difference between the first frequency spectrum and the second frequency spectrum is minimized as a decoding result.

According to this configuration, in the first frequency spectrum calculation step, the first frequency spectrum in a predetermined frequency range is calculated from the detection signal in a predetermined segment. In the second frequency spectrum calculation step, the second frequency spectrum corresponding to an expectation signal of a pattern of the digital information that is present in the predetermined segment and obtained via the medium is calculated. In the frequency spectrum difference calculation step, the difference between the first frequency spectrum and the second frequency spectrum is calculated. In the decoding step, the digital information is decoded by selecting a pattern in which the difference between the first frequency spectrum and the second frequency spectrum is minimized as a decoding result.

Therefore, the difference between the first frequency spectrum in the predetermined frequency range and the second frequency spectrum corresponding to the expectation signal of the pattern of the digital information that is present in the predetermined segment and obtained via the medium is calculated, and the pattern in which the calculated difference is minimized is selected as the decoding result. Thus, even when the frequency characteristic of the medium is present in a frequency range where the gain of the optical transfer function is absent, it is possible to efficiently decode signals from only the frequency characteristic in a low frequency range where the gain of the optical transfer function is zero or higher, to suppress deterioration of the decoding performance, and to reliably decode the digital information.

Moreover, in the above decoding method, it is preferable that the frequency spectrum difference calculation step involves calculating a squared value of a difference between a real part of the first frequency spectrum and a real part of the second frequency spectrum and a squared value of a difference between an imaginary part of the first frequency spectrum and an imaginary part of the second frequency spectrum and calculating the sum of the squared value of the difference in the real part and the squared value of the difference in the imaginary part in the predetermined frequency range as the difference between the first frequency spectrum and the second frequency spectrum.

According to this configuration, the squared value of a difference between a real part of the first frequency spectrum and a real part of the second frequency spectrum and a squared value of a difference between an imaginary part of the first frequency spectrum and an imaginary part of the second frequency spectrum is calculated. Moreover, the sum of the squared value of the difference in the real part and the squared value of the difference in the imaginary part in the predetermined frequency range as the difference between the first frequency spectrum and the second frequency spectrum is calculated.

Therefore, by calculating the sum of the squared value of the difference between the real part of the first frequency spectrum and the real part of the second frequency spectrum and the squared value of the difference between the imaginary part of the first frequency spectrum and the imaginary part of the second frequency spectrum, it is possible to easily calculate the difference between the first frequency spectrum and the second frequency spectrum.

Moreover, in the above decoding method, it is preferable that the frequency spectrum difference calculation step involves calculating the difference between the first frequency spectrum and the second frequency spectrum in a frequency range where a gain of a predetermined value or higher is obtained for the predetermined frequency characteristic of the medium.

According to this configuration, the difference between the first frequency spectrum and the second frequency spectrum is calculated in a frequency range where a gain of a predetermined value or higher is obtained for the predetermined frequency characteristic of the medium. Thus, since the difference between the first frequency spectrum and the second frequency spectrum is calculated from the first frequency spectrum and the second frequency spectrum in an effective frequency range, noise components are separated, and S/N efficiency can be improved.

Moreover, in the above decoding method, it is preferable that the medium includes an optical disc, and the predetermined frequency range used in the frequency spectrum difference calculation step is a frequency range lower than a normalized frequency $(2 \cdot NA \cdot T)/\lambda$, when the length of one channel bit where the digital information is recorded on the optical disc is denoted as "T", the wavelength of light irradiated to the optical disc is denoted as "$\lambda$", and a numerical aperture of an objective lens that condenses the light onto the optical disc is denoted as "NA".

According to this configuration, the medium includes an optical disc. The predetermined frequency range used in the frequency spectrum difference calculation step is a frequency range lower than a normalized frequency $(2 \cdot NA \cdot T)/\lambda$ when the length of one channel bit where the digital information is recorded on the optical disc is denoted as "T", the wavelength of light irradiated to the optical disc is denoted as "$\lambda$", and a numerical aperture of an objective lens that condenses the light onto the optical disc is denoted as "NA".

Thus, it is possible to calculate the difference between the first frequency spectrum and the second frequency spectrum in a frequency range that is lower than the normalized frequency $(2 \cdot NA \cdot T)/\lambda$.

Moreover, in the above decoding method, it is preferable that the decoding method further includes a correction step of correcting the second frequency spectrum so that the difference between the first frequency spectrum and the second frequency spectrum corresponding to the pattern selected in the decoding step decreases.

According to this configuration, in the correction step, the second frequency spectrum is corrected so that the difference between the first frequency spectrum and the second frequency spectrum corresponding to the pattern selected in the decoding step decreases.

Thus, it is possible to reduce errors in the difference between the first frequency spectrum and the second frequency spectrum occurring due to the change in the frequency characteristic of the medium.

A decoding device according to another aspect of the present invention is a decoding device for decoding digital information based on a detection signal obtained from a medium having a predetermined frequency characteristic, including: a first frequency spectrum calculation unit that calculates a first frequency spectrum in a predetermined frequency range from the detection signal in a predetermined segment; a second frequency spectrum calculation unit that calculates a second frequency spectrum corresponding to an expectation signal of a pattern of the digital information that is present in the predetermined segment and obtained via the medium; a frequency spectrum difference calculation unit that calculates a difference between the first frequency spectrum and the second frequency spectrum; and a decoding unit that decodes the digital information by selecting a pattern in which the difference between the first frequency spectrum and the second frequency spectrum is minimized as a decoding result.

According to this configuration, the first frequency spectrum calculation unit calculates the first frequency spectrum in a predetermined frequency range from the detection signal in a predetermined segment. The second frequency spectrum calculation unit calculates the second frequency spectrum corresponding to an expectation signal of a pattern of the digital information that is present in the predetermined segment and obtained via the medium. The frequency spectrum difference calculation unit calculates the difference between the first frequency spectrum and the second frequency spectrum. The decoding unit decodes the digital information by selecting a pattern in which the difference between the first frequency spectrum and the second frequency spectrum is minimized as a decoding result.

Therefore, the difference between the first frequency spectrum in the predetermined frequency range and the second frequency spectrum corresponding to the expectation signal of the pattern of the digital information that is present in the predetermined segment and obtained via the medium is calculated, and the pattern in which the calculated difference is minimized is selected as the decoding result. Thus, even when the frequency characteristic of the medium is present in a frequency range where the gain of the optical transfer function is absent, it is possible to efficiently decode signals from only the frequency characteristic in a low frequency range where the gain of the optical transfer function is zero or higher, to suppress deterioration of the decoding performance, and to reliably decode the digital information.

In the above decoding device, it is preferable that the frequency spectrum difference calculation unit calculates a squared value of a difference between a real part of the first frequency spectrum and a real part of the second frequency spectrum and a squared value of a difference between an imaginary part of the first frequency spectrum and an imaginary part of the second frequency spectrum and calculates the sum of the squared value of the difference in the real part and the squared value of the difference in the imaginary part in the predetermined frequency range as the difference between the first frequency spectrum and the second frequency spectrum.

According to this configuration, the squared value of a difference between a real part of the first frequency spectrum and a real part of the second frequency spectrum and a squared value of a difference between an imaginary part of the first frequency spectrum and an imaginary part of the second frequency spectrum is calculated. Moreover, the sum of the squared value of the difference in the real part and the squared value of the difference in the imaginary part in the predetermined frequency range as the difference between the first frequency spectrum and the second frequency spectrum is calculated.

Therefore, by calculating the sum of the squared value of the difference between the real part of the first frequency spectrum and the real part of the second frequency spectrum and the squared value of the difference between the imaginary part of the first frequency spectrum and the imaginary part of the second frequency spectrum, it is possible to easily calculate the difference between the first frequency spectrum and the second frequency spectrum.

Moreover, in the above decoding device, it is preferable that the frequency spectrum difference calculation unit calculates the difference between the first frequency spectrum and the second frequency spectrum in a frequency range where a gain of a predetermined value or higher is obtained for the predetermined frequency characteristic of the medium.

According to this configuration, the difference between the first frequency spectrum and the second frequency spectrum is calculated in a frequency range where a gain of a predetermined value or higher is obtained for the predetermined frequency characteristic of the medium. Thus, since the difference between the first frequency spectrum and the second frequency spectrum is calculated from the first frequency spectrum and the second frequency spectrum in an effective frequency range, noise components are separated, and S/N efficiency can be improved.

Moreover, in the above decoding device, it is preferable that the medium includes an optical disc, and the predetermined frequency range used in the frequency spectrum difference calculation unit is a frequency range lower than a normalized frequency $(2 \cdot NA \cdot T)/\lambda$ when the length of one channel bit where the digital information is recorded on the optical disc is denoted as "T", the wavelength of light irradiated to the optical disc is denoted as "$\lambda$", and a numerical aperture of an objective lens that condenses the light onto the optical disc is denoted as "NA".

According to this configuration, the medium includes an optical disc. The predetermined frequency range used in the frequency spectrum difference calculation unit is a frequency range lower than a normalized frequency $(2 \cdot NA \cdot T)/\lambda$ when the length of one channel bit where the digital information is recorded on the optical disc is denoted as "T", the wavelength of light irradiated to the optical disc is denoted as "$\lambda$", and a numerical aperture of an objective lens that condenses the light onto the optical disc is denoted as "NA".

Thus, it is possible to calculate the difference between the first frequency spectrum and the second frequency spectrum in a frequency range that is lower than the normalized frequency $(2 \cdot NA \cdot T)/\lambda$.

Moreover, in the above decoding device, it is preferable that the decoding device further includes a correction unit that corrects the second frequency spectrum so that the difference between the first frequency spectrum and the second frequency spectrum corresponding to the pattern selected by the decoding unit decreases.

According to this configuration, the correction unit corrects the second frequency spectrum so that the difference between the first frequency spectrum and the second frequency spectrum corresponding to the pattern selected in the decoding step decreases.

Thus, it is possible to reduce errors in the difference between the first frequency spectrum and the second frequency spectrum occurring due to the change in the frequency characteristic of the medium.

Specific embodiments and examples described in the Description of Embodiments section merely clarify the technical contents of the present invention and are not be considered in a limiting sense because various changes and modifications can be made within the scope of the claims and without departing from the spirit of the present invention.

INDUSTRIAL APPLICABILITY

The decoding method and decoding device according to the present invention can suppress deterioration of the decoding performance and reliably decode digital information and are useful as a decoding method and a decoding device for decoding digital information based on a detection signal obtained from a medium having a predetermined frequency characteristic. Moreover, the decoding method and decoding device according to the present invention are useful in increasing the density of optical discs or increasing the transmission rate of optical communication.

The invention claimed is:

1. A decoding method for decoding digital information based on a detection signal obtained from a medium having a predetermined frequency characteristic, comprising:
    a first frequency spectrum calculation step of calculating a first frequency spectrum in a predetermined frequency range from the detection signal in a predetermined segment;
    a second frequency spectrum calculation step of calculating a second frequency spectrum corresponding to an expectation signal of a pattern of the digital information that is present in the predetermined segment and obtained via the medium;
    a frequency spectrum difference calculation step of calculating a difference between the first frequency spectrum and the second frequency spectrum; and
    a decoding step of decoding the digital information by selecting a pattern in which the difference between the first frequency spectrum and the second frequency spectrum is minimized as a decoding result;
    wherein:
    the medium includes an optical disc, and
    the predetermined frequency range used in the frequency spectrum difference calculation step is a frequency range that is lower than a normalized frequency $(2 \cdot NA \cdot T)/\lambda$ wherein the length of one channel bit where the digital information is recorded on the optical disc is denoted as T, the wavelength of light irradiated to the optical disc is denoted as $\lambda$, and a numerical aperture of an objective lens that condenses the light onto the optical disc is denoted as NA.

2. The decoding method according to claim 1, wherein
    the predetermined frequency range is a frequency range that is lower than a frequency determined according to the predetermined frequency characteristic, and
    the frequency spectrum difference calculation step involves calculating the difference between the first frequency spectrum and the second frequency spectrum in the predetermined frequency range.

3. The decoding method according to claim 2, further comprising:
    a correction step of correcting the second frequency spectrum so that the difference between the first frequency spectrum and the second frequency spectrum corresponding to the pattern selected in the decoding step decreases.

4. The decoding method according to claim 1, wherein
    the frequency spectrum difference calculation step involves calculating a squared value of a difference between a real part of the first frequency spectrum and a real part of the second frequency spectrum and a squared value of a difference between an imaginary part of the first frequency spectrum and an imaginary part of the second frequency spectrum and calculating the sum of the squared value of the difference in the real part and the squared value of the difference in the imaginary part in the predetermined frequency range as the difference between the first frequency spectrum and the second frequency spectrum.

5. A decoding device for decoding digital information based on a detection signal obtained from a medium having a predetermined frequency characteristic, comprising:
    a first frequency spectrum calculation unit that calculates a first frequency spectrum in a predetermined frequency range from the detection signal in a predetermined segment;
    a second frequency spectrum calculation unit that calculates a second frequency spectrum corresponding to an expectation signal of a pattern of the digital information that is present in the predetermined segment and obtained via the medium;
    a frequency spectrum difference calculation unit that calculates a difference between the first frequency spectrum and the second frequency spectrum; and
    a decoding unit that decodes the digital information by selecting a pattern in which the difference between the first frequency spectrum and the second frequency spectrum is minimized as a decoding result;
    wherein:
    the medium includes an optical disc, and
    the predetermined frequency range used in the frequency spectrum difference calculation unit is a frequency range that is lower than a normalized frequency $(2 \cdot NA \cdot T)/\lambda$ when the length of one channel bit where the digital information is recorded on the optical disc is denoted as T, the wavelength of light irradiated to the optical disc is denoted as $\lambda$, and a numerical aperture of an objective lens that condenses the light onto the optical disc is denoted as NA.

6. The decoding device according to claim 5, wherein
    the predetermined frequency range is a frequency range that is lower than a frequency determined according to the predetermined frequency characteristic, and the frequency spectrum difference calculation unit calculates the difference between the first frequency spectrum and the second frequency spectrum in the predetermined frequency range.

7. The decoding device according to claim 6, further comprising:
a correction unit that corrects the second frequency spectrum so that the difference between the first frequency spectrum and the second frequency spectrum corresponding to the pattern selected by the decoding unit decreases.

8. The decoding device according to claim 5, wherein
the frequency spectrum difference calculation unit calculates a squared value of a difference between a real part of the first frequency spectrum and a real part of the second frequency spectrum and a squared value of a difference between an imaginary part of the first frequency spectrum and an imaginary part of the second frequency spectrum and calculates the sum of the squared value of the difference in the real part and the squared value of the difference in the imaginary part in the predetermined frequency range as the difference between the first frequency spectrum and the second frequency spectrum.

\* \* \* \* \*